(12) United States Patent
Terwal et al.

(10) Patent No.: US 11,398,802 B2
(45) Date of Patent: Jul. 26, 2022

(54) COMMON MODE VOLTAGE CONTROLLER FOR SELF-BOOSTING PUSH PULL AMPLIFIER

(71) Applicant: Bose Corporation, Framingham, MA (US)

(72) Inventors: Remco Terwal, West Newton, MA (US); Thomas Omar Powell, Waltham, MA (US)

(73) Assignee: BOSE CORPORATION, Framingham, MA (US)

( * ) Notice: Subject to any disclaimer, the term of this patent is extended or adjusted under 35 U.S.C. 154(b) by 155 days.

(21) Appl. No.: 16/829,750

(22) Filed: Mar. 25, 2020

(65) Prior Publication Data

US 2021/0305952 A1 Sep. 30, 2021

(51) Int. Cl.
| | |
|---|---|
| *H03F 3/38* | (2006.01) |
| *H03F 3/217* | (2006.01) |
| *H03F 3/26* | (2006.01) |
| *H03F 1/02* | (2006.01) |
| *H03F 3/45* | (2006.01) |
| *H03G 3/30* | (2006.01) |
| *H04R 3/00* | (2006.01) |

(52) U.S. Cl.
CPC ........... *H03F 3/265* (2013.01); *H03F 1/0244* (2013.01); *H03F 3/45179* (2013.01); *H03G 3/3026* (2013.01); *H04R 3/00* (2013.01); *H03F 3/2171* (2013.01); *H03F 3/2173* (2013.01); *H03F 2200/03* (2013.01)

(58) Field of Classification Search
CPC .... H03F 3/265; H03F 1/0244; H03F 3/45179; H03F 2200/03; H03F 2200/351; H03F 1/3282; H03F 3/185; H03F 3/2173; H03F 3/181; H03F 1/3264; H03G 3/3026; H04R 3/00
USPC .......................... 330/10, 207 A, 251; 381/121
See application file for complete search history.

(56) References Cited

U.S. PATENT DOCUMENTS

| | | | |
|---|---|---|---|
| 4,186,437 A | | 1/1980 | Cuk |
| 5,866,969 A | * | 2/1999 | Shimada ............... H01L 41/044 310/318 |

(Continued)

OTHER PUBLICATIONS

PCT International Search Report and Written Opinion for International Application No. PCT/US2021/020793, dated Jun. 11, 2021, 10 pages.

*Primary Examiner* — Khanh V Nguyen
(74) *Attorney, Agent, or Firm* — Hoffman Warnick LLC

(57) ABSTRACT

Various implementations include systems for amplifying input signals. In particular implementations, a system includes a common mode voltage controller configured to receive an input signal and output a pair of adjusted signals; a modulator that generates a pair of pulse width modulation (PWM) signals in response to the adjusted signals; and a self-boosting push pull amplifier configured to receive the PWM signals and generate an amplified output, wherein the self-boosting push pull amplifier is configured to generate a differential mode voltage representative of an amplified version of the input signal, wherein the adjusted audio signals generated by the common mode voltage controller include a dynamically adjusted gain and duty cycle offset that causes the self-boosting push pull amplifier to operate with a reduced common mode voltage.

20 Claims, 8 Drawing Sheets

(56) References Cited

U.S. PATENT DOCUMENTS

| | | | |
|---|---|---|---|
| 6,373,334 B1 * | 4/2002 | Melanson | H03M 1/1235 |
| | | | 330/10 |
| 7,840,015 B1 * | 11/2010 | Melanson | H03F 1/52 |
| | | | 381/107 |
| 8,018,280 B2 * | 9/2011 | Chen | H03F 1/523 |
| | | | 330/251 |
| 9,473,851 B2 * | 10/2016 | Galal | H03G 11/00 |
| 2002/0067209 A1 | 6/2002 | Luo et al. | |
| 2014/0369529 A1 | 12/2014 | Quinn | |
| 2020/0021256 A1 | 1/2020 | Terwal et al. | |

* cited by examiner

Peak Gain Calculation

$V_{outmax} := 24$    Differential Output Peak Voltage when audio input Av is equal to 1

$G := \dfrac{V_{outmax} \cdot A_V}{V_{BATT}}$    $G = 0.083$    Required gain for peak demand relative to battery $V_{phmin} := 2$    Minimum +/- output phase voltage (irrespective of audio volume)

Maximum and Minimum duty cycle WITHOUT phase voltage minimization:

$$D_{max} := \dfrac{(G-2) + \sqrt{(2-G)^2 + 4 \cdot G}}{2 \cdot G}$$

$D_{min} := 1 - D_{max}$

Figure 4

Maximum and Minimum Duty Cycle WITH phase voltage minimization:

$$K' := \frac{V_{phmin}}{V_{BATT} + V_{phmin}} \qquad K' = 0.143$$

Instantaneous Common Mode Duty Cyle Offset (positive for lower idle) given a needed gain and the actual battery voltage available.

$$D'_{cm} := \frac{-2 \cdot K' + 1 - G \cdot K' + G \cdot K'^2}{2 + 2 \cdot G - 2 \cdot G \cdot K'} \qquad D'_{cm} = 0.329$$

$$D'_{min} := D'_{cm} + K' \qquad D'_{max} := 1 - D'_{min}$$

Required audio gain adjustment along with the common-mode shift D'cm:

$$A_{adj} := \frac{D'_{max} - 0.5}{D_{max} - 0.5}$$

Figure 5

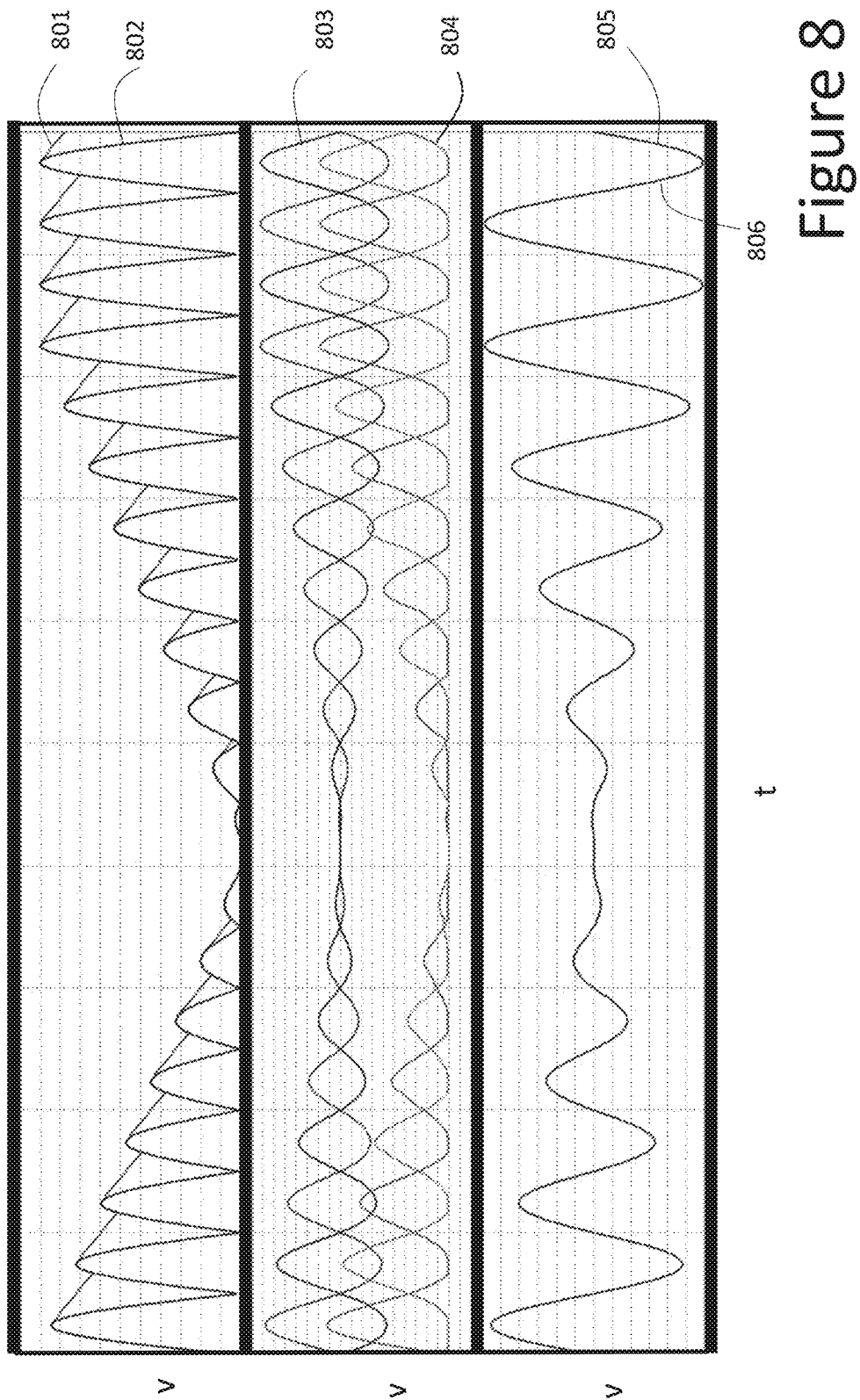

COMMON MODE VOLTAGE CONTROLLER FOR SELF-BOOSTING PUSH PULL AMPLIFIER

TECHNICAL FIELD

This disclosure generally relates to self-boosting amplifier power dissipation reduction techniques, and more particularly to a common mode voltage controller for a fourth order self-boosting push pull amplifier.

BACKGROUND

A switching audio amplifier can be used to drive speakers for sound reproduction. For example, class-D amplifiers are amplifiers in which amplifying components (e.g., transistors) operate as electronic switches that rapidly switch back and forward between various power supply rails to encode an audio signal into a pulse train. Once processed to remove the high frequency components, the audio signal can be outputted to a loudspeaker for audio acoustical reproduction.

Various types of class-D amplifier exist, all typically derived from a fundamental switching converter topology of various orders. The order designates the number of passive components with energy storing capability inside the fundamental converter circuit. Examples of second order topologies are the buck, boost and buck-boost converters. Examples of fourth order topologies include the Ćuk, SEPIC and Zeta converters. A class-D amplifier is created by using such a converter and adjusting it by manipulating the duty cycle of a voltage pulse train. Class-D amplifiers provide a high conversion efficiency given that the transistors never conduct current at the same time they have voltage across them. The only losses that occur are a result of non-ideal transistor switching behavior and component non-idealities in the form of parasitic resistances.

SUMMARY

All examples and features mentioned below can be combined in any technically possible way.

Systems involving self-boosting push pull amplifiers are provided, and certain implementations include a common mode voltage controller configured to receive an input signal such as an audio signal and output a pair of adjusted signals; a modulator that generates a pair of pulse width modulation (PWM) signals in response to the adjusted signals; a self-boosting push pull amplifier configured to receive the PWM signals and generate an amplified output, wherein the self-boosting push pull amplifier is configured to generate a differential mode voltage representative of an amplified version of the input signal; and wherein the adjusted signals generated by the common mode voltage controller include a dynamically adjusted gain and duty cycle offset that causes the self-boosting push pull amplifier to operate with a reduced common mode voltage.

In additional implementations, a common mode voltage controller for a self-boosting push pull amplifier is provided. The common mode voltage controller processes signals according to a method that includes: receiving an input signal, such as an audio signal; calculating a maximum duty cycle of the input signal; calculating a maximum adjusted duty cycle and a duty cycle offset of the input signal; dynamically adjusting the gain of the input signal to generate a gain adjusted signal in response to the maximum duty cycle and the maximum adjusted duty cycle; and applying the duty cycle offset to the gain adjusted signal to generate a pair of adjusted signals, wherein the adjusted signals are configured to reduce a common mode voltage of a self-boosting push pull amplifier while maintaining a substantially unchanged differential mode voltage.

In some implementations, the input signal includes a pulse code modulation (PCM) signal, and the adjusted signals comprise modified PCM signals. In further implementations, the input signal includes an analog signal.

In some aspects, the common mode voltage controller includes: a system that evaluates the input signal and determines a detected level; a standard duty cycle calculator that determines a maximum duty cycle associated with the input signal in response to the detected level, a defined supply voltage and a defined maximum output; and an adjusted duty cycle calculator that determines a maximum adjusted duty cycle and a duty cycle offset in response to the detected level, the defined supply voltage, the defined maximum output, and a defined minimum phase voltage value.

In additional aspects, the common mode voltage controller includes a gain adjust system for dynamically adjusting the gain of the input signal in response to the maximum duty cycle and maximum adjusted duty cycle to ensure that the differential mode voltage remains representative of the input signal.

In certain implementations, the duty cycle offset is applied to a gain adjusted signal outputted from the gain adjust system to generate the pair of adjusted signals.

In some aspects, the gain adjusted signal is computed according the formula: gain adjusted signal=(adjusted maximum duty cycle)−0.5/(maximum duty cycle)−0.5.

In some implementations, the self-boosting push pull amplifier includes two fourth order Zeta converter halves creating an eight order differential amplifier.

In other implementations, the adjusted signals generated by the common mode voltage controller further includes a dynamically adjusted duty cycle.

Two or more features described in this disclosure, including those described in this summary section, may be combined to form implementations not specifically described herein.

The details of one or more implementations are set forth in the accompanying drawings and the description below. Other features, objects and benefits will be apparent from the description and drawings, and from the claims

BRIEF DESCRIPTION OF THE DRAWINGS

FIG. 4 depicts equations for calculating a maximum and minimum duty cycle without phase voltage minimization according to various implementations.

FIG. 5 depicts equations for calculating a maximum and minimum duty cycle with phase voltage minimization and common mode duty cycle offset according to various implementations.

FIG. 8 depicts a graph showing a peak detector waveform and the associated single ended and differential signal outputs with and without common mode adjustment according to various implementations.

Figure 1:
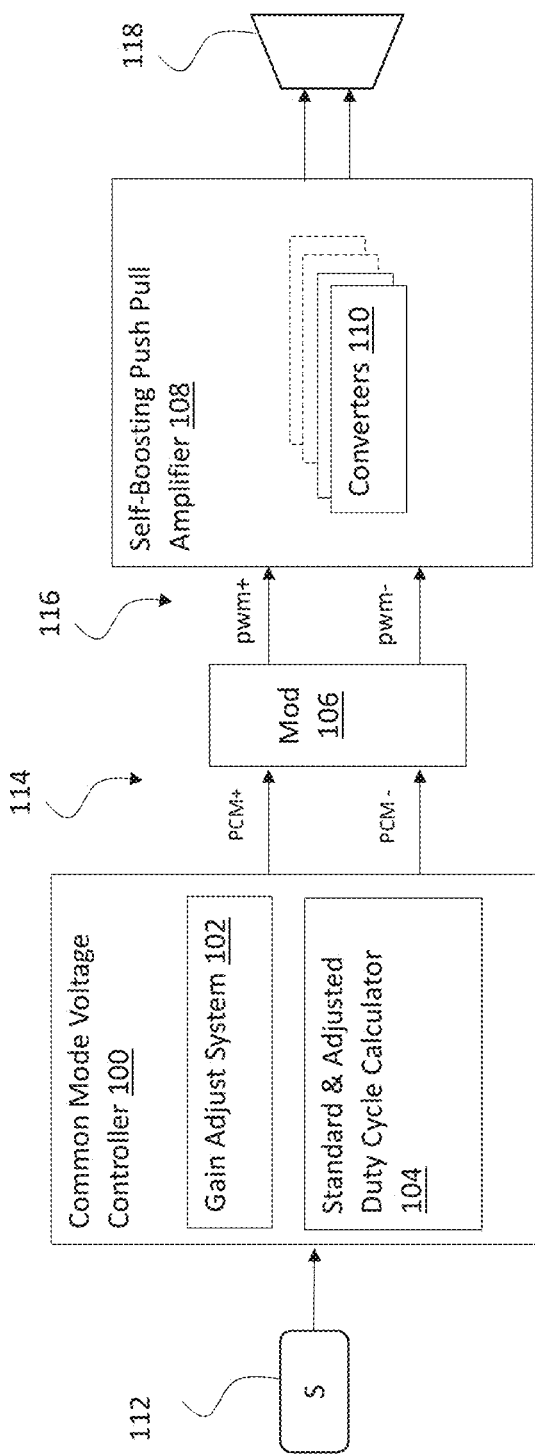
FIG. 1 depicts a block diagram of an amplifier system according to various implementations.

It is noted that the drawings of the various implementations are not necessarily to scale. The drawings are intended to depict only typical aspects of the disclosure, and therefore should not be considered as limiting the scope of the implementations. In the drawings, like numbering represents like elements between the drawings.

DETAILED DESCRIPTION

Various implementations describe an amplifier system that includes a self-boosting push pull amplifier and a common mode voltage controller that causes the self-boosting push pull amplifier to operate with a reduced common mode voltage. It is noted that while the various implementations described herein are directed to amplifying audio signals, the solutions could likewise be applied to other types of signals, e.g., motor control signals, power inverter signals, other control signals, etc.

Switching amplifiers can be formed by taking a fundamental converter and placing it between a power supply and a load. The amplification is the action of modulating the duty cycle such as to vary the output voltage over time in a congruent manner but with a higher voltage and/or current into the load. The time-variation of the duty cycle and thus the output signal is determined by an input signal. In the case of an audio amplifier, this input signal is an audio waveform. Typically, the goal of an amplifier is to increase the voltage and/or current amplitude of the input signal to an output voltage and/or current amplitude, which is ideally higher by a constant factor, also called gain.

Because power supply voltage levels are limited in available output power and because component operating voltages and currents are necessarily limited for component reliability purposes, circuit combinatorial techniques are used to increase the gain beyond the level achievable with just one fundamental converter topology circuit. When a higher output voltage is needed, one common approach is two use two fundamental converters and place the load between the outputs of these two blocks. The inputs signals for each circuit are the same albeit in opposite phase considering the duty cycle. This is often referred to as a push-pull or two-phase configuration. More than two blocks can be used as well, leading to three phase, four phase and higher phase converters along with properly phase-shifted input signals. The output voltage capability is increased without increasing the component stresses of the fundamental circuits.

When current amplification is needed, parallel configurations of fundamental converter blocks are used and the input signals are kept in phase. The output current capability is thereby increased without changing the stresses inside the fundamental circuits. Combinatorial techniques can be used for higher voltage and/or current driving capabilities of the amplifiers. When converters are used with energy storing capabilities, e.g., second order boost converters or higher order converters with associated boost capabilities, such as fourth order Ćuk or Zeta converters, these combinatorial techniques may still not be enough to prevent excessive component stresses inside the converters. Adding more fundamental circuits and/or using more capable components may not be economically feasible.

The failure rate of electronic components is usually a strong function of thermal stresses on the component as well as peak voltage stress across, and current stress through, those components. The exposure time of components to these stresses is a strong factor for component failure rate as well. In the case of an audio amplifier, the signal to be amplified is an audio signal and the audio signal can vary widely in signal amplitude over time. When normalized to a certain maximum level, e.g., 1, and compared to each other, audio signals have a low average level over a long duration, e.g., an entire audio track of several minutes long typically includes occasional, temporally repeating high peaks in the one millisecond (ms) to one-hundred milliseconds ranges. The ratio of the audio average voltage level to the peak voltage level is called the crest-factor and is typically expressed in decibels (dB). A large sample of audio signals has shown that crest-factors typically vary between 10 and 20 dB. When crest-factors of these audio files are compared over short time windows in the 1-100 ms range within the audio files itself, an even larger crest-factor range is observed typically between 3 and 24 dB. The observed median crest-factor is in the middle, e.g., around 15 dB, while the outlying higher and lower crest-factors are statistically much less encountered.

Accordingly, the amplifier spends statistically very little time at the peak voltage of its output. The components are only infrequently stressed over the duration of the typical audio file at maximum playback volume. Moreover, one can conclude that in boosting amplifier circuit topologies, boosting or high supply voltages are only infrequently needed. During the time there is a need for a low output voltage, the supply voltage can be momentarily reduced thereby reducing the stress on the amplifier components even more. Solutions have been provided in the past the exploit this feature. Examples are combinations of power supplies, boosting or not that can vary their output level based on the need driven by the audio signal. Supplies may be adjusted in a stepwise fashion, typically referred to as a class-G amplifier or in a continuously variable fashion, typically referred to as a class-H amplifier. Many variations of such topologies have been shown over time. They typically all involve the need for some time offset to ramp the supplies up and down in preparation for the signal peak that needs to be produced in the load.

In self-boosting push pull amplifiers, such as described in US patent application publication, US2020/0021256, "Self-Boosting Amplifier" by Terwal et al., and in U.S. Pat. No. 4,186,437 "Push Pull Switching Power Amplifier" by Ćuk, which are both hereby incorporated by reference, the voltage and current boosting function is an integral function of the amplifier circuit topology and cannot be isolated compared to a power supply amplifier cascaded arrangement. This type of amplifier can produce a very high output voltage instantaneously. In fact, the output voltage of a fundamental Zeta converter can be above and below the power supply voltage. The same is true for a Buck-Boost, Ćuk or SEPIC converter, albeit that the output polarity is opposite to the power supply relative to ground.

At the same time, the internal voltages across the components as well as the currents through the components can become very high at high duty cycle levels, e.g., high peak output voltages and currents into the load. As a result, components are stressed at these peak outputs of the amplifier signal. In the Zeta amplifier, for example, it is also observed that the idle common-mode output voltage on the positive and negative outputs is approximately at battery level even if the differential voltage output is very low, on the order of millivolts or even zero volt.

Implementations provided herein lower this common mode voltage in a dynamic manner, thereby reducing the stresses and losses on the internal components of a self-boosting push-pull amplifier (such as a Zeta) power stage. Depending on the audio input signal, the switch duty cycles inside the positive and negative sides of the Zeta push pull amplifier are manipulated such that the required differential output is produced while at the same time the common mode levels of the amplifier are just high enough to support the required differential output. When more differential output is needed, the common mode voltage of the positive and negative sides is increased dynamically at the same time to support the required differential signal. As a result, the stresses and thermal losses inside of the amplifier power stage can be kept to a minimum.

Because audio signals are statistically more likely to be at low output levels and only occasionally burst to higher peak levels, the amplifier size can be reduced based on average power loss and thermal considerations. At the same time, lowering the internal voltage and current stresses in the amplifier power stage results in a more reliable design.

Various implementations include reducing the MOSFET conduction and MOSFET switching losses by lowering the MOSFET drain-source peak voltages and drain-source currents through lowering the output common mode voltages. The common mode voltage is lowered by adjusting the duty cycle control law in such a way as to not affect the target differential output voltage, while at the same time lowering the common mode output voltage to a maximum extent possible. This adjustment is a real-time adjustment based on the instantaneous audio input voltage and the instantaneous battery voltage present. A re-adjustment can be made every switching cycle to take maximum advantage of the potential power loss reduction for the whole amplifier. The adjustment is done in such a way that no input audio delay is required to allow the power amplifier to settle itself in preparation for outputting a high peak voltage, as is typically needed with class-G and class-H type of designs.

FIG. 1 depicts an illustrative amplifier system that includes a common mode voltage controller 100, a modulator (Mod) 106 and a self-boosting push pull amplifier 108. Implementations of the common mode voltage controller 100 include a gain adjust system 102 and a standard and adjusted duty cycle calculator 104 that are configured to process an inputted audio signal 112 and output a pair of adjusted audio signals 114. The adjusted audio signals 114 may for example include a pulse width modulated audio signal, a pulse code modulation (PCM) signal, a pulse density modulated (PDM) signal, or an analog signal. The pair of adjusted audio signals 114 are fed into modulator 106, such as an AD modulator, a BD modulator, or any other similar type of modulator. The modulator 106 generates a pair of pulse width modulation (PWM) signals 116 in response to the adjusted audio signals 114. The PWM signals 116 are fed into the self-boosting push pull amplifier 108, which includes a set of converters 110 configured to generate an amplified audio output to an acoustic transducer 118, such as a speaker. The self-boosting push pull amplifier 108 generates a differential mode voltage representative of an amplified version of the audio signal 112. The adjusted audio signals 114 generated by the common mode voltage controller 100 include a dynamically adjusted gain and duty cycle offset that causes the self-boosting push pull amplifier 108 to operate with a reduced common mode voltage.

A standard duty cycle calculator (in 104) determines a maximum duty cycle associated with the audio signal 112 in response to a detected audio level Av, a defined supply voltage, and a defined maximum output. An adjusted duty cycle calculator (in 104) determines a maximum adjusted duty cycle and a duty cycle offset in response to the detected audio level Av, the defined supply voltage, the defined maximum output, and a defined minimum phase voltage value. The gain adjust system 102 then dynamically adjusts the gain of the audio signal 112 in response to the calculated maximum duty cycle and the calculated maximum adjusted duty cycle to ensure that the differential mode voltage remains representative of the audio signal 112. The calculated duty cycle offset is applied to a gain adjusted signal outputted from the gain adjust system 102 to generate the pair of adjusted audio signals 114.

Figure 2:
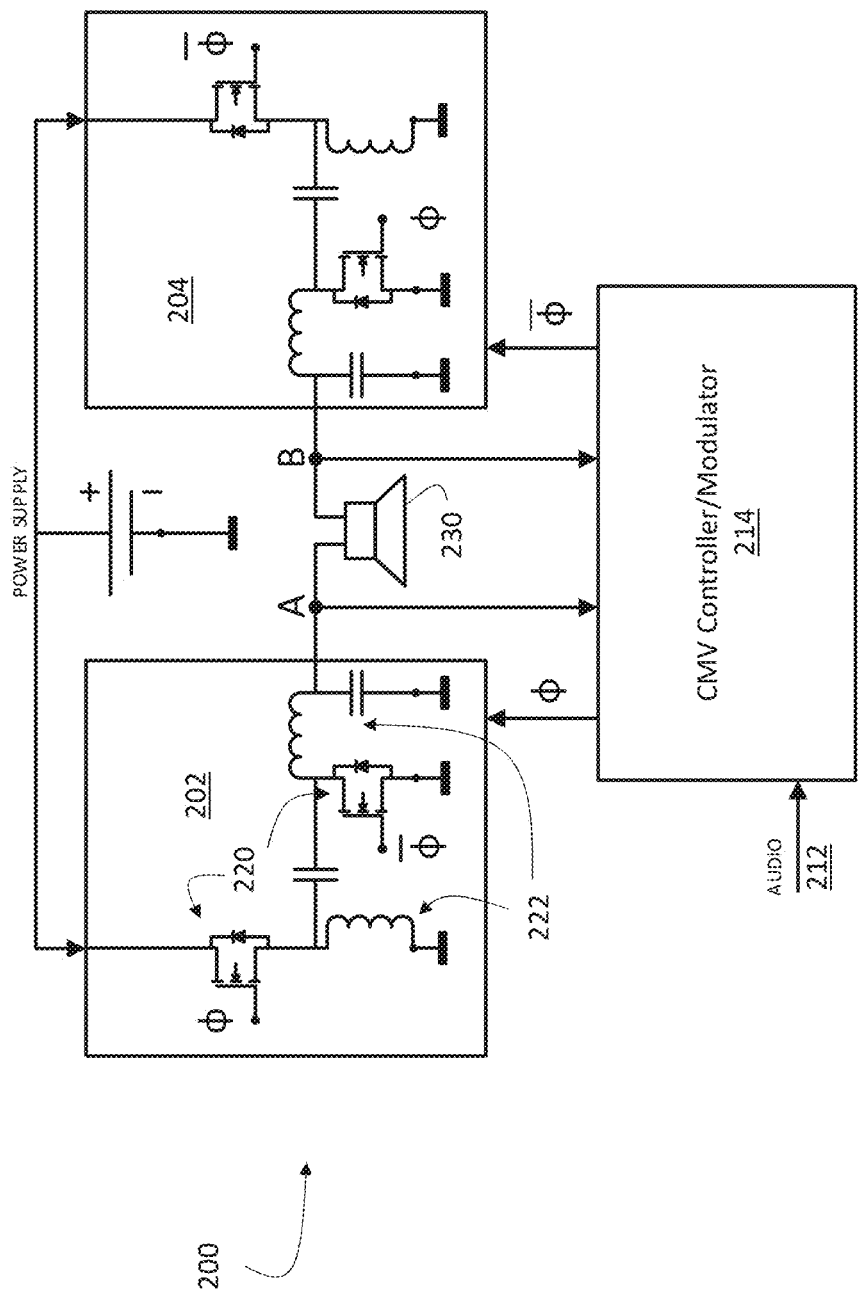
FIG. 2 depicts a block diagram of an amplifier system that includes a Zeta amplifier according to various implementations.

FIG. 2 depicts an illustrative implementation in which a Zeta amplifier 200 is utilized as the self-boosting push pull amplifier, and includes two stages 202, 204. Similar to the embodiment of FIG. 1, an input audio signal 212 is fed into a common mode voltage (CMV) controller/modulator 214, which outputs a pair of adjusted signals to the Zeta amplifier 200, which then outputs an amplified signal to acoustic transducer 230. Each stage 202, 204 includes a set of MOSFETS and power storage components (e.g., 220, 222), labeled in stage 202. By forming a push-pull arrangement, a combination of a differential and a common mode voltage on output nodes voltages A and B is inherently created. The differential voltage, V(A)−V(B), when present, is the amplified audio signal to be applied to the acoustic transducer 230. The common mode voltage (V(A)+V(B))/2 is the result of the outputs assuming a voltage level relative to the battery input controlled by the Zeta converter's switch duty cycle.

Figure 3:
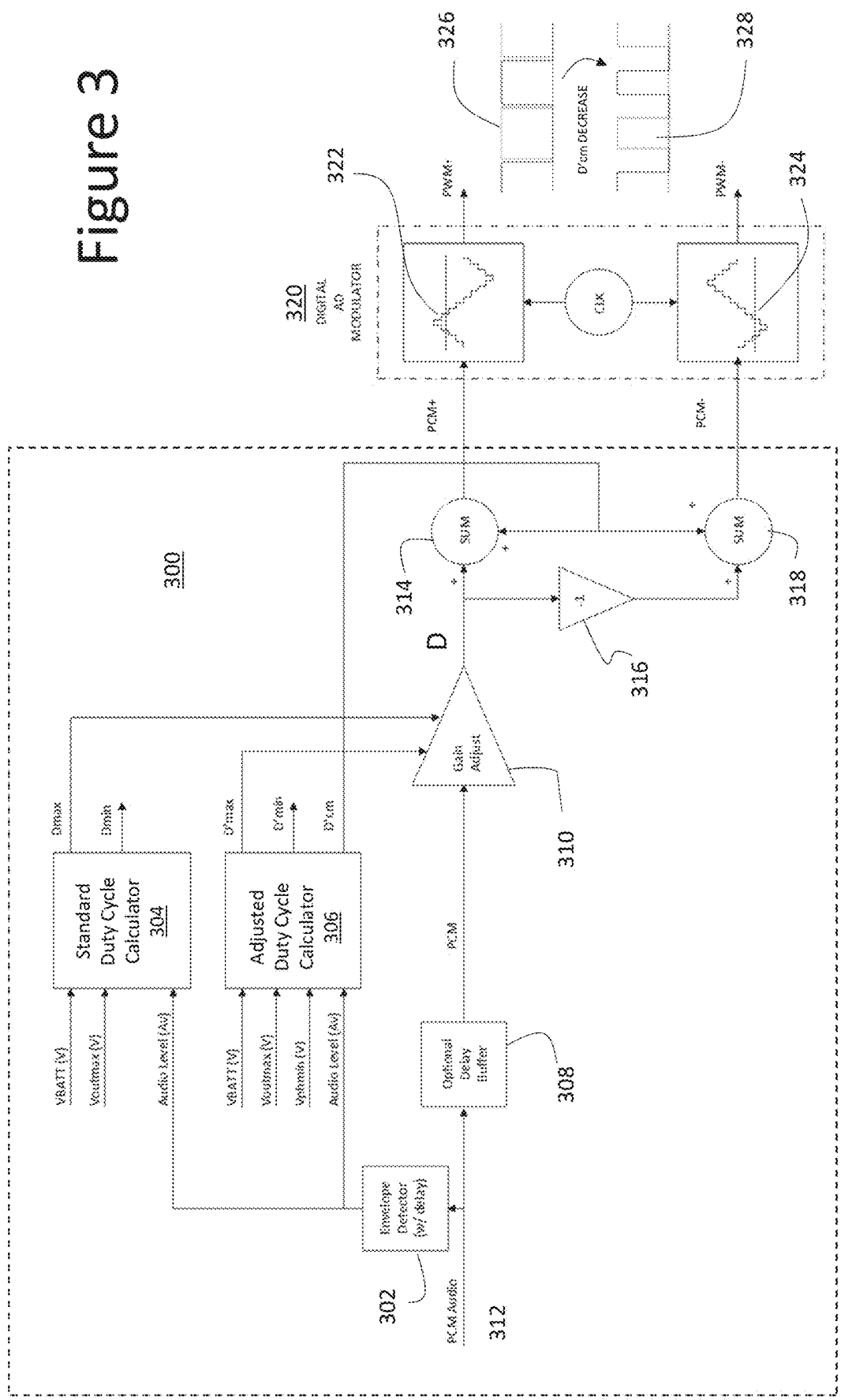
FIG. 3 depicts a common mode voltage controller according to various implementations.

FIG. 3 shows a detailed block diagram of a common mode voltage controller 300 and modulator 320 configured to adjust the individual MOSFET control duty cycles generated inside a Zeta (or other self-boosting push pull) amplifier control block. In this example, the audio signal 312 is inputted to the common mode voltage controller 300 in a digital pulse code modulation (PCM) form. However, it is understood that analog implementations can likewise be implemented. Further, it is understood that the example shown in FIG. 3 represents one possible implementation for dynamically adjusting gain to cause a self-boosting push pull amplifier to operate with a reduced common mode voltage.

As shown, the inputted audio 312 is processed by an envelope detector 302 to generate an audio level (Av), which is fed into two different parameter calculators, standard duty cycle calculator 304 and adjusted duty cycle calculator 306. It is noted that envelop detector 302 is one example of detecting the audio level and other approaches may be used (e.g., a circuit that implements a polynomial transfer function). In addition, the PCM signal is passed through an optional delay buffer 308 and through a gain adjust system 310 that generates a signal indicative of the duty cycle based on the calculator outputs. Standard duty cycle calculator 304 calculates the maximum duty cycle needed and allowed to achieve the maximum required differential output voltage without consideration of common mode shifting the amplifier output phases (Dmax). It also produces a symmetrical minimum output duty cycle Dmin. These duty cycles Dmin, Dmax also serve as the maximum allowed duty cycle for the power converter.

Standard duty cycle calculator 304 takes the battery voltage Vbatt into account as well as the maximum target differential output voltage Voutmax in combination with a detected instantaneous peak input audio level Av. When the battery is lowered for the same output levels, more boosting is needed to produce the same output level. Because a constant average energy is delivered to the load for a given output level, the input takes the same amount of energy into the power converter, ignoring inefficiency in the conversion process. When the battery voltage is lowered, the current must go up to preserve the constant energy flow. The common mode voltage controller 300 needs to protect for excess component currents, especially for the MOSFETs. High duty cycles can produce high MOSFET drain-source voltages as well as drain-source currents that could result in damaging the MOSFETs, unlike traditional buck derived class-D amplifiers. A control law may be included to reduce the maximum duty cycle when such a condition occurs. When the battery voltage is increased, component currents will reduce. However, the peak voltage across the MOSFETs increases at the same time. A control law may be included to reduce the maximum duty cycle when such a condition occurs. Dmax and Dmin are calculated as shown in FIG. 4.

Adjusted duty cycle calculator 306 calculates the control parameter modifications that are needed to adjust the parameters Dmax and Dmin to adjust the common mode voltage of the output. D'max is the adjusted maximum duty cycle needed after a common-mode adjustment modification. D'min is the minimum adjusted duty cycle. Whereas Dmin and Dmax are typically symmetrical around D=0.50, D'min and D'max are not. FIG. 5 shows the calculations that are performed. Adjusted duty cycle calculator 306 ultimately puts out two variables, the duty cycle offset D' cm that needs to be subtracted from D as well as D'max and D'min (D'max and D'min are related to each other through relationship D'min=1−D'max) to calculate a gain correction on the audio signal 312 to be applied with the common mode offset. Inverter 316 in combination with the summation elements 314 and 318 implement the subtraction operation. The gain correction is applied by the gain adjust system 310.

This gain correction is necessary as the gain changes when the average operating point is moved along the gain-duty-cycle curve. In other words, if the common mode is shifted to a new operating point, the gain must be adjusted to ensure that the differential output of the amplifier does not change. The resulting adjusted signals (in this example, PCM signals) are output to modulator 320, in this case an AD digital modulator. One PCM signal with corrected gain is applied to a first modulator 322 where it is compared to a digitally generated triangle wave. The comparison dials in what duty cycle is needed for every audio sample applied and can therefore be regarded as a duty cycle command. The other half of the modulator 324 takes the second adjusted PCM audio signal. The duty cycle offset is added to the audio duty cycle command, which effectively reduces the duty cycle considering the way the comparators are configured, as shown in unmodified and modified signals 326 and 328, respectively.

The differential gain results in the following corrected transfer function (ignoring parasitic losses):

$$V(\text{outdiff})/V(\text{batt})=2*D-1/D*(1-D)+D'cm+D'cm^2$$

This can be compared to the uncorrected transfer function, which would be as follows:

$$V(\text{out})=V(A)-V(B)=2*D-1/D*(1-D)$$

Figure 6:
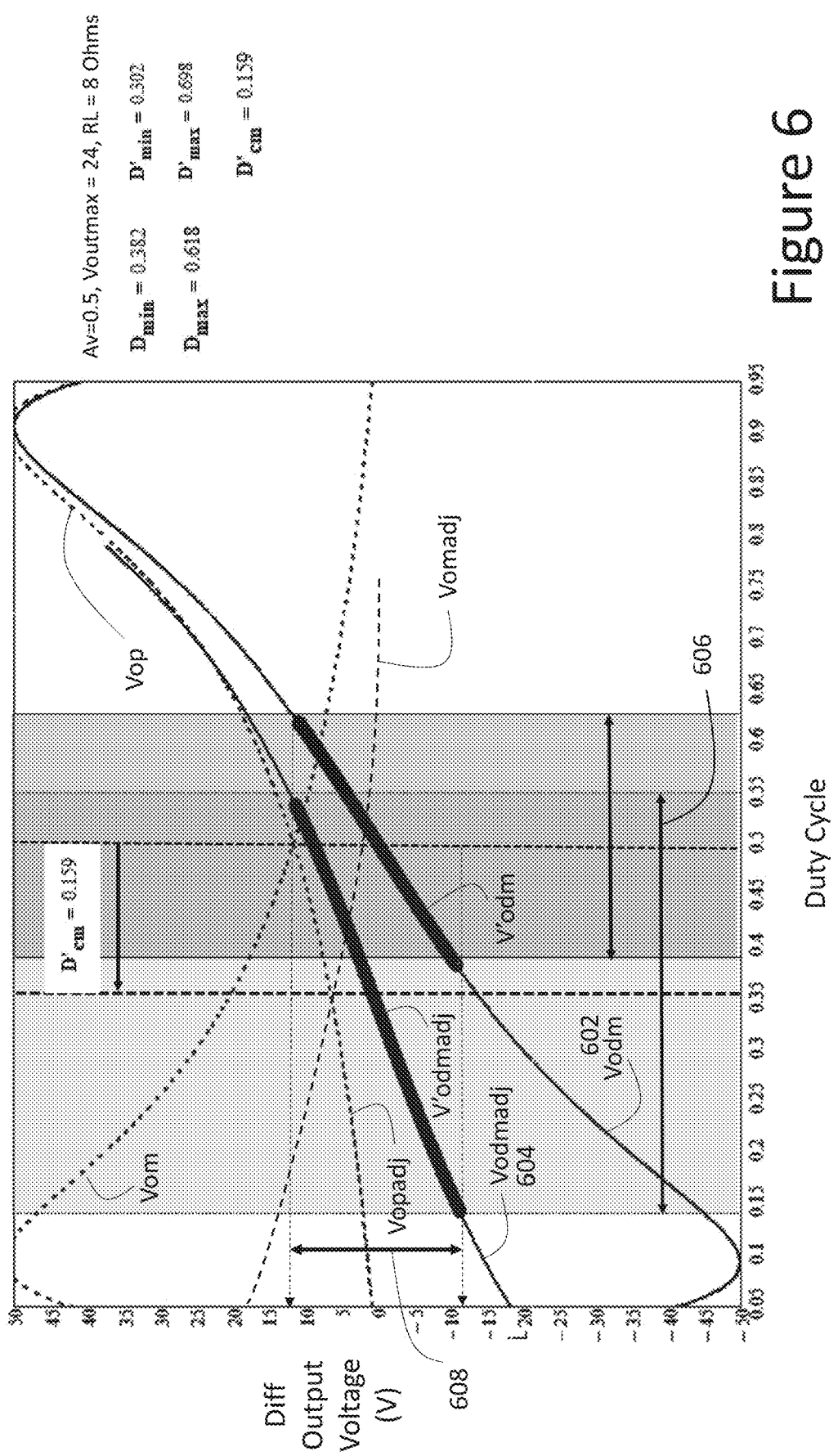
FIG. 6 depicts a graph of an uncorrected and corrected response according to various implementations.

FIG. 6 shows a graphical plot depicting an example of an uncorrected 602 (Vodm) and adjusted 604 (Vodmadj) large signal response versus duty cycle in a single graph. The gain of the power stage reduces with lower common mode as shown by the reduced slope of curve 604 compared to the curve 602. However, with the increased duty cycle range through input signal gain adjustments, the output is maintained in curve 604. The thickened sections V'odm and V'odmadj of the curves 602, 604 show the range set by Dmax and Dmin for the curve 602 and D'max and D'min for the curve 604, i.e., after the common mode adjustment and input signal gain adjustments are applied.

Figure 7:
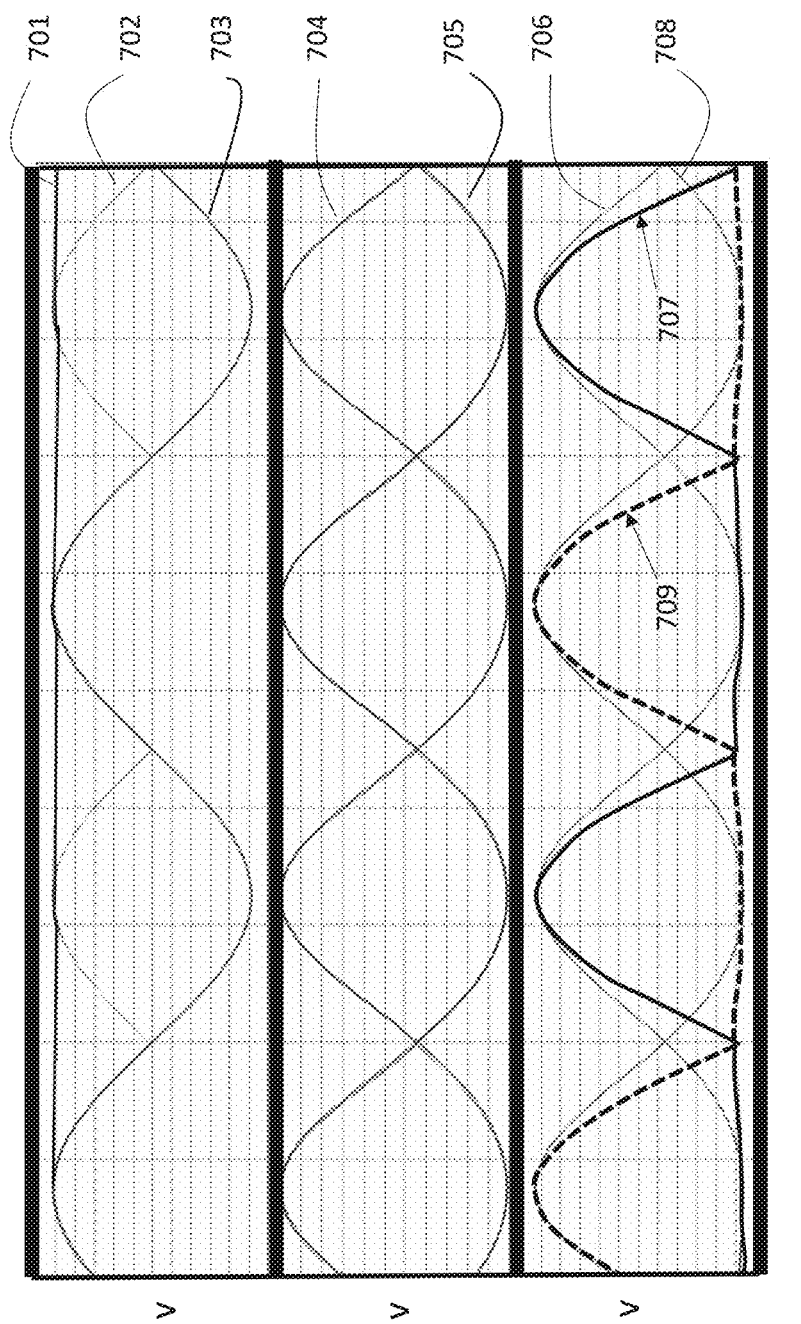
FIG. 7 depicts a graph showing the effect of different level detector Av responses according to various implementations.

FIG. 7 shows graphical plots illustrating the effect of different level detector Av responses over time. The common mode level of the audio amplifier is largely controlled by Av and the battery voltage as dynamically changing input parameters to the common mode voltage controller. In FIG. 7, a fast and a slow envelope detector version are shown. Waveform 702 is a fast detector and represents an almost full wave rectification of the input audio 703, and 701 is a slow detector that simply communicates the audio peak levels. When the full wave rectified version 702 of the audio is used as Av, the output phase waveforms are represented by waveforms 707 and 709. Compare these to the non-common mode adjusted output phase voltages shown by waveforms 704 and 705. Depending on the differential output polarity of the amplifier, the output voltage is almost driven by one phase or the other phase. This is single-ended like behavior of the amplifier output instead of symmetrical push pull. The absolute voltage on each phase is minimum. When the slow detector 701 is used, the output phases behave in a more symmetrical push-pull manner while reducing the absolute phase voltages at the same time. Curves 706 and 708 show the slow response output forms. However, especially near zero audio, the voltage is not optimally minimized as in the fast detector case. Of course, any speed between these two extremes can be chosen to provide results in between the two shown.

It should be noted that while a faster Av will maximize power savings, supporting the full audio bandwidth for Av translates to change rates for the common mode level that may result into some practical issues. An example is the introduction of potentially high currents in the Zeta amplifier output capacitors to ground. Another example is the concern of RF emissions from the output wires when the common mode voltage component is modulated very quickly. Accordingly, in some implementations, one may want to limit the bandwidth of Av to meet the needs and capability of the system. For example, one solution is to slowly and smoothly change Av to achieve better EMC performance.

FIG. 8 shows graphical plots illustrating an example of a peak detector waveform 801 that does not change smoothly with respect to the input signal 802. The common mode shifted phase voltages 804 show discontinuities leading to higher harmonic content in the signal while the non-shifted version 803 does not. Despite these common mode discontinuities, the differential outputs 805 and 806 shows no discontinuities in the ideal case.

In these examples, a peak detector is used to set the audio level Av input to the calculators 304, 306 (FIG. 3). In some implementations, approaches other than a peak detector can be utilized and provide a different transfer function. For example, the audio level input can be manipulated with a transfer function made from a polynomial that relates a certain audio input to a certain Av output. In such approaches, the phase voltage responses can then be shaped as desired. A potential benefit of using such an approach could reduce computational overhead compared to using a peak detector. Other transfer functions are likewise possible with the same objective of minimizing phase voltage and thus MOSFET losses.

One benefit of the approach of the system illustrated in the plots in FIG. 8 is that no excess latency is added, thus allowing the Zeta amplifier to be used in low latency audio systems. Amplifiers that are designed with external boost supplies combined with buck derived class-D amplifiers typically require an audio look ahead delay in order to allow the power supply to ramp up to the required level. This delay, which can be of the order of milliseconds, introduces substantial latency. In audio systems that require noise cancelation or include video systems, this delay can become problematic.

As is evident, implementations of a common mode voltage controller can substantially reduce phase voltages, which results in lower losses. For example, certain implementations can readily reduce average phase voltages from 12V to 5V, or even more, resulting in substantial savings. Furthermore, lowering the output phase common mode voltages pushes the efficiency up at lower output levels where audio files statistically spend most time. Implementations of common mode adjustment techniques therefore provide great benefits for applications that run on batteries by extending playtime substantially, as well as running the amplifier at a relatively lower operating temperature.

It is understood that one or more of the functions of the amplifier system may be implemented as hardware and/or software, and the various components may include communications pathways that connect components by any conventional means (e.g., hard-wired and/or wireless connection). For example, one or more non-volatile devices (e.g., centralized or distributed devices such as flash memory device(s)) can store and/or execute programs, algorithms and/or parameters for one or more described devices. Additionally, the functionality described herein, or portions thereof, and its various modifications (hereinafter "the functions") can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions. All or part of the functions can be implemented as, special purpose logic circuitry, e.g., an FPGA (field programmable gate array) and/or an ASIC (application-specific integrated circuit). Processors suitable for the execution of a computer program include, by way of example, both general and special purpose microprocessors, and any one or more processors of any kind of digital computer. Generally, a processor may receive instructions and data from a read-only memory or a random access memory or both. Components of a computer include a processor for executing instructions and one or more memory devices for storing instructions and data.

In various implementations, electronic components described as being "coupled" can be linked via conventional hard-wired and/or wireless means such that these electronic components can communicate data with one another. Additionally, sub-components within a given component can be considered to be linked via conventional pathways, which may not necessarily be illustrated.

A number of implementations have been described. Nevertheless, it will be understood that additional modifications may be made without departing from the scope of the inventive concepts described herein, and, accordingly, other implementations are within the scope of the following claims.

What is claimed is:

1. An amplifier system, comprising:
    a common mode voltage controller configured to receive an input signal and output a pair of adjusted signals;
    a modulator that generates a pair of pulse width modulation (PWM) signals in response to the pair of adjusted signals; and
    a self-boosting push pull amplifier configured to receive the PWM signals and generate an amplified output, wherein the self-boosting push pull amplifier is configured to generate a differential mode voltage representative of an amplified version of the input signal,
    wherein the pair of adjusted signals generated by the common mode voltage controller include an adjusted gain and duty cycle offset that are configured to reduce a common mode voltage of the self-boosting push pull amplifier.

2. The amplifier system of claim 1, wherein the input signal comprises a pulse code modulation (PCM) signal.

3. The amplifier system of claim 1, wherein the input signal comprises an analog signal.

4. The amplifier system of claim 1, wherein the common mode voltage controller comprises:
    a system that evaluates the input signal and determines a detected level;
    a standard duty cycle calculator that determines a maximum duty cycle associated with the input signal in response to the detected level, a defined supply voltage and a defined maximum output; and
    an adjusted duty cycle calculator that determines a maximum adjusted duty cycle and the duty cycle offset in response to the detected level, the defined supply voltage, the defined maximum output, and a defined minimum phase voltage value.

5. The amplifier system of claim 4, wherein the common mode voltage controller further comprises a gain adjust system for adjusting the gain of the input signal in response to the maximum duty cycle and maximum adjusted duty cycle to ensure that the differential mode voltage remains representative of the input signal.

6. The amplifier system of claim 5, wherein the duty cycle offset is applied to a gain adjusted signal outputted from the gain adjust system to generate the pair of adjusted signals.

7. The amplifier system of claim 6, wherein the gain adjusted signal is computed according to a formula:

$$\text{gain adjusted signal} = (\text{adjusted maximum duty cycle}) - 0.5 / (\text{maximum duty cycle}) - 0.5.$$

8. The amplifier system of claim 1, wherein the self-boosting push pull amplifier comprises two fourth order Zeta converter halves creating an eighth order differential amplifier.

9. The amplifier system of claim 1, wherein the pair of adjusted signals generated by the common mode voltage controller further comprise adjusted duty cycle.

10. The amplifier system of claim 1, wherein the input signal comprises one of an audio signal, a motor control signal or a power inverter signal.

11. A common mode voltage controller for a self-boosting push pull amplifier, wherein the common mode voltage controller processes signals according to a method that comprises:
 receiving an input signal;
 calculating a maximum duty cycle based upon the input signal;
 calculating a maximum adjusted duty cycle and a duty cycle offset based upon the input signal;
 adjusting the gain of the input signal to generate a gain adjusted signal in response to the calculated maximum duty cycle and the calculated maximum adjusted duty cycle; and
 applying the calculated duty cycle offset to the gain adjusted signal to generate a pair of adjusted signals, wherein the pair of adjusted signals are configured to reduce a common mode voltage of the self-boosting push pull amplifier while maintaining a substantially unchanged differential mode voltage.

12. The common mode voltage controller of claim 11, wherein the input signal comprises one of an analog signal or a pulse code modulation (PCM) signal.

13. The common mode voltage controller of claim 11, wherein the common mode voltage controller is further configured to process the input signal to determine a detected level.

14. The common mode voltage controller of claim 13, wherein the common mode voltage controller is further configured to: process the detected level, a defined supply voltage and a defined maximum output to calculate the maximum duty cycle.

15. The common mode voltage controller of claim 13, wherein the common mode voltage controller is further configured to: process the detected level, a defined supply voltage, a defined maximum output and a defined minimum phase voltage value to calculate the maximum adjusted duty cycle and duty cycle offset.

16. The common mode voltage controller of claim 13, wherein the detected level is detected with an envelope detector or a circuit that implements a polynomial transfer function.

17. The common mode voltage controller of claim 11, wherein the common mode voltage controller is further configured to generate a pair of pulse width modulation (PWM) signals in response to the pair of adjusted signals using a modulator.

18. The common mode voltage controller of claim 17, wherein the common mode voltage controller is further configured to input the PWM signals into a power conversion stage of the self-boosting push pull amplifier.

19. The common mode voltage controller of claim 11, wherein the gain adjusted signal is computed according a formula:

$$\text{gain adjusted signal} = (\text{adjusted maximum duty cycle}) - 0.5/(\text{maximum duty cycle}) - 0.5.$$

20. The common mode voltage controller of claim 11, wherein the pair of adjusted signals are processed by a modulator.

* * * * *